(12) United States Patent
Sudo et al.

(10) Patent No.: US 11,205,489 B2
(45) Date of Patent: Dec. 21, 2021

(54) SEMICONDUCTOR APPARATUS AND CONTINUOUS READ METHOD

(71) Applicant: Winbond Electronics Corp., Taichung (TW)

(72) Inventors: Naoaki Sudo, Kanagawa (JP); Takamichi Kasai, Kanagawa (JP); Hiroyuki Kaga, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 58 days.

(21) Appl. No.: 16/816,288

(22) Filed: Mar. 12, 2020

(65) Prior Publication Data

US 2020/0372959 A1 Nov. 26, 2020

(30) Foreign Application Priority Data

May 21, 2019 (JP) .............................. JP2019-094939

(51) Int. Cl.
*G11C 16/26* (2006.01)
*G06F 11/10* (2006.01)
*G11C 16/32* (2006.01)
*G11C 16/04* (2006.01)

(52) U.S. Cl.
CPC .......... *G11C 16/26* (2013.01); *G06F 11/1068* (2013.01); *G11C 16/0483* (2013.01); *G11C 16/32* (2013.01)

(58) Field of Classification Search
CPC ........... G11C 7/106; G11C 7/22; G11C 16/32; G11C 7/1066; G11C 16/16; G11C 16/26; G11C 16/10; G11C 16/0483; G06F 11/1068
See application file for complete search history.

(56) References Cited

U.S. PATENT DOCUMENTS

| 8,230,175 | B1 | 7/2012 | Vaccaro et al. |
| 10,783,095 | B2 * | 9/2020 | Kaminaga ............... G06F 13/28 |
| 2007/0058480 | A1 | 3/2007 | Hwang |

(Continued)

FOREIGN PATENT DOCUMENTS

| CN | 103578535 | 2/2014 |
| JP | 5323170 | 10/2013 |

(Continued)

OTHER PUBLICATIONS

"Office Action of Taiwan Counterpart Application", dated Sep. 14, 2020, p. 1-p. 5.

(Continued)

*Primary Examiner* — Guy J Lamarre
(74) *Attorney, Agent, or Firm* — JCIPRNET

(57) ABSTRACT

A semiconductor storage apparatus capable of realizing continuous read with high speed is provided. A continuous read method of a NAND flash memory includes: a step for holding setting information related to a read time of a memory cell array in continuous read in a register; a step for reading data from the memory cell array in the read time based on the setting information; a step for holding the read data in a latch (L1) and a latch (L2); and a step for outputting the data held synchronously with an external clock signal corresponding to the setting information.

14 Claims, 7 Drawing Sheets

(56) References Cited

U.S. PATENT DOCUMENTS

| | | | | |
|---|---|---|---|---|
| 2010/0030954 A1* | 2/2010 | Miura | ............... | G06F 13/4217 |
| | | | | 711/104 |
| 2012/0106254 A1* | 5/2012 | Sano | ................. | G11C 16/08 |
| | | | | 365/185.18 |
| 2013/0297987 A1* | 11/2013 | Gupta | ................ | G06F 11/1064 |
| | | | | 714/773 |
| 2014/0104947 A1 | 4/2014 | Yamauchi et al. | | |
| 2016/0034352 A1 | 2/2016 | Michael et al. | | |
| 2018/0090202 A1* | 3/2018 | Kaminaga | ............ | G11C 7/1051 |

FOREIGN PATENT DOCUMENTS

| | | |
|---|---|---|
| JP | 5667143 | 2/2015 |
| KR | 100543461 | 1/2006 |
| KR | 20180034190 | 4/2018 |
| TW | I627632 | 6/2018 |

OTHER PUBLICATIONS

"Office Action of Korea Counterpart Application", dated Jan. 27, 2021, with English translation thereof, pp. 1-10.

\* cited by examiner

| | Erase | Write | Read |
|---|---|---|---|
| Selected W/L | 0 | 15~20V | 0 |
| Non-selected W/L | F | 10V | 4.5 |
| SGD | F | Vcc | 4.5 |
| SGS | F | 0 | 4.5 |
| SL | F | Vcc | 0 |
| P well | 21 | 0 | 0 |

| Address | Value | Definition |
|---|---|---|
| XXh | 1 | • Frequency Fr: 80 MHz<Fr<120 MHz under DDR<br>• Clock stop is prohibited in continuous read |
| | 0 | • Frequency Fr: 80 MHz or less under DDR<br>• Frequency Fr: 166 MHz or lower under SDR (All ranges) |

SEMICONDUCTOR APPARATUS AND CONTINUOUS READ METHOD

CROSS-REFERENCE TO RELATED APPLICATION

This application claims the priority benefit of Japan application serial no. 2019-094939, filed on May 21, 2019. The entirety of the above-mentioned patent application is hereby incorporated by reference herein and made a part of this specification.

BACKGROUND OF THE INVENTION

1. Field of the Invention

The disclosure relates to a semiconductor apparatus, and specifically, to continuous read of a NAND flash memory.

2. Description of Related Art

In a NAND flash memory, a continuous read function (a burst read function) for reading multiple pages continuously in response to an external command is carried. For example, a page buffer/sensing circuit includes two latches, when an action of continuous read is performed, during a period in which data read from an array is held in one latch, data held in the other latch may be outputted (for example, patent documents 1, 2, and 3).

EXISTING TECHNICAL DOCUMENTS

Patent Documents

[Patent document 1] Japanese patent publication No. 5323170
[Patent document 2] Japanese patent publication No. 5667143
[Patent document 3] US patent application No. US2014/0104947A1

SUMMARY OF THE INVENTION

Problems to be Resolved by the Disclosure

FIG. 1 represents general composition of a NAND flash memory carrying an on chip error checking and correction (ECC) function. The flash memory includes a memory cell array 10 including a NAND string, a page buffer/sensing circuit 20, a data transmitting circuit 30, a data transmitting circuit 32, an error checking and correction circuit (hereinafter referred to as an ECC circuit) 40, and an input/output circuit 50. The page buffer/sensing circuit 20 includes two latches L1 and L2 configured to hold read data or input data to be programmed, and the latch L1 and the latch L2 each include a first cache C0 and a second cache C1 (one cache is, for example, 2 KB).

FIG. 2 is a sequence diagram during continuous read of multiple pages. First, array read of page 0 is performed, and data of the page 0 is held in the first cache C0 and the second cache C1 (P0C0 and P0C1) of the latch L1. Then, data in the first cache C0 and the second cache C1 of the latch L1 is transmitted to the first cache C0 and the second cache C1 of the latch L2. The data in the first cache C0 and the second cache C1 is subjected to an ECC decoding operation in the ECC circuit 40. In a case that an error is detected, the data in the first cache C0 and the second cache C1 of the latch L2 is corrected.

In continuous read, a column address counter is automatically incremented and read of the next page is performed. Read data is transmitted to the first cache C0 and the second cache C1 of the latch L1. In this period, data in the first cache C0 of the latch L2 is transmitted to the input/output circuit 50, and data held by the input/output circuit 50 is outputted synchronously with an external clock signal ExCLK provided externally. Then, data in the second cache C1 of the latch L2 is outputted from the input/output circuit 50 synchronously with the external clock signal ExCLK, and in this period, data in the first cache C0 of the latch L1 is transmitted to the latch L2 and is subjected ECC processing performed by the ECC circuit.

In the period when the data in the second cache C1 of the latch L1 is transmitted to the latch L2 and the data in the first cache C0 of the latch L2 is outputted from the input/output circuit 50, data in the second cache C1 of the second latch L2 goes through ECC processing. Then, in the period when the data in the second cache C1 of the latch L2 is outputted from the input/output circuit 50, the next page 2 is read from the array and is transmitted to the first cache C0 and the second cache C1 of the latch L1, and data in the first cache C0 is transmitted to the latch L2 for ECC processing.

In this way, data is outputted from the latch L2 while continuous read of pages of the memory cell array is performed. In this period, ECC processing on the second cache C1 is performed while the data in the first cache C0 is outputted, and ECC processing on the first cache C0 is performed while the data in the second cache C1 is outputted.

Based on this, read of an array is performed by using an internal clock signal according to a determined time. On the other hand, data outputting is performed according to an external clock signal asynchronous with the internal clock signal ExCLK. Therefore, in an action of continuous read, there is a limitation as shown in the following expression.

$$tARRAY+tECC<tDOUT \quad (1)$$

In this expression, tARRAY is a time required for reading a selected page from a memory cell array, tECC is a time required for performing ECC processing on ½ page, and tDOUT is a time required for outputting all data in one page. tARRAY and tECC are fixed time, and tDOUT is calculated according to frequency of the external clock signal ExCLK.

In a NAND flash memory, a large amount of data needs to be read in a short time, but it may be learned from the expression (1) that, when the action of continuous read is performed, an upper limit of the frequency of the external clock signal ExCLK is limited. On the other hand, if the page buffer or a peripheral circuit includes another latch L3, the limitation of the expression (1) may be relieved as expression (2). However, this requires a large layout area and the costs are high.

$$tDOUT>tARRAY, tDOUT>tECC \quad (2)$$

The disclosure is directed to resolve the existing problems, and provide a semiconductor apparatus and a continuous read method capable of realizing continuous read with high speed.

Technical Solutions for Resolving Problems

The continuous read method of a NAND flash memory includes: a step for reading data from a memory cell array based on setting information related to a read time of the memory cell array in continuous read; a step for holding the read data; and a step for outputting the data held synchronously with an external clock signal corresponding to the setting information.

In an embodiment of the disclosure, the continuous read method further includes a step for externally inputting the setting information. In an embodiment of the disclosure, the continuous read method further includes a step for holding the setting information. In an embodiment of the disclosure, the setting information includes a first value or a second value, the first value defines a first read time corresponding to high-speed frequency of the external clock signal, the second value defines a second read time corresponding to low-speed frequency of the external clock signal, and the first read time is earlier than the second read time. In an embodiment of the disclosure, the semiconductor apparatus further includes an error checking and correction (ECC) component for performing ECC on the data held and the continuous read method further includes a step for performing ECC on the data held. When the setting information includes a first value, a limitation of tARRAY<tDOUT (one page) and tECC<tDOUT (½ page) is defined, and when the setting information includes a second value, a limitation of tARRAY+tECC<tDOUT is defined (where tARRAY is a time for reading data from the memory cell array, tECC is a time for performing ECC on ½ page, and tDOUT is a time for outputting one page). In an embodiment of the disclosure, the holding component and the step for holding include a first latch for holding the data read from the memory cell array and a second latch for holding data transmitted from the first latch. The first latch and the second latch each include a first part and a second part capable of transmitting data independently. The first part and the second part are capable of holding data of ½ page. When data in the first part of the second latch is outputted, ECC is performed on data in the second part of the second latch, and when the data in the second part of the second latch is outputted, ECC is performed on the data in the first part of the second latch. In an embodiment of the disclosure, when the setting information includes a first value, tARRAY is a time for reading data of n pages of the memory cell array, tDOUT is a time for outputting data of first parts of (n−1) pages and data of second parts of (n−2) pages.

The disclosure includes a semiconductor apparatus of a NAND memory cell array, and the apparatus includes: a reading component configured to read data from the memory cell array; a holding component configured to hold data read by the reading component; an outputting component capable of outputting the data held by the holding component synchronously with an external clock signal; and a control component configured to control the reading component, where the control component controls continuous read based on setting information related to a read time of the memory cell array in continuous read, and the outputting component outputs the data held by the holding component synchronously with an external clock signal corresponding to the setting information.

In an embodiment of the disclosure, the semiconductor apparatus further includes an inputting component configured to externally input the setting information. In an embodiment of the disclosure, the semiconductor apparatus further includes a register configured to hold the setting information. In an embodiment of the disclosure, the outputting component outputs data in response to a rising edge and a falling edge of the external clock signal.

Effects of the Disclosure

According to the disclosure, data is read from a memory cell array based on setting information related to a read time of the memory cell array in continuous read. Therefore, continuous read with high speed can be realized, and data destruction can be prevented.

DESCRIPTION OF THE EMBODIMENTS

Next, embodiments of the disclosure are described in detail with reference to drawings. A semiconductor apparatus of the disclosure is, for example, a NAND flash memory or a microprocessor, a microcontroller, logic, an application specific integrated circuit (ASIC), a processor for processing images or sound, a processor for processing signals such as wireless signals, or the like embedded in the NAND flash memory.

Embodiment

Figures 3, 4:
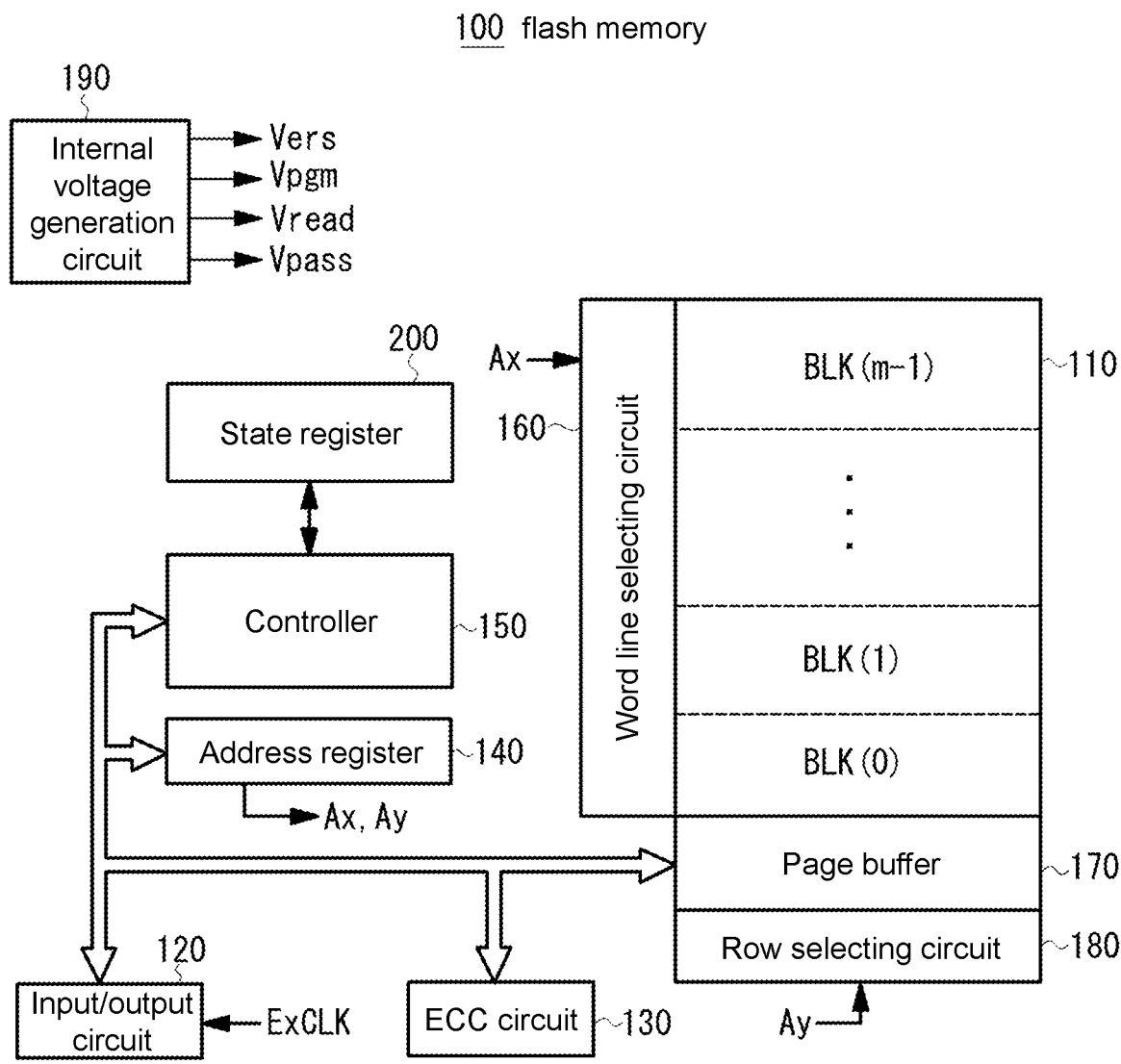
FIG. 3 is a block diagram representing composition of a NAND flash memory according to an embodiment of the disclosure.
FIG. 4 is an exemplary table representing bias voltages applied during actions of a NAND flash memory.

FIG. 3 is a diagram representing composition of a NAND flash memory according to an embodiment of the disclosure. A flash memory 100 in the present embodiment includes a memory array 110 in which a plurality of memory cells is arranged in a matrix; an input/output circuit 120 that is connected to an external input/output terminal and outputs read data to the external or fetch externally inputted data in response to an external clock signal ExCLK; an error checking and correction (ECC) circuit 130 which performs ECC on data to be programmed or the read data; an address register 140 which receives address data through the input/output circuit 120; a controller 150, which controls each part based on command data received through the input/output circuit 120 or a control signal applied to a terminal; a word line selecting circuit 160, which receives column address information Ax from the address register 140, decodes the column address information Ax, and selects a column block and a word line based on a decoding result; a page buffer/sensing circuit 170, which holds data read from a page selected by the word line selecting circuit 160, or holds data to be programmed into the selected page; a row selecting circuit 180, which receives row address information Ay from the address register 140 to decode the row address information Ay, and selects a row in the page buffer/sensing circuit 170 based on a decoding result; an internal voltage generation circuit 190, which generates various voltages (a programming voltage Vpgm, a pass voltage Vpass, a read pass voltage Vread, an erase voltage Vers, and the like) required for read, programming, and erasing of data; and a state register 200, which holds setting information related to a read time of a memory cell array in continuous read.

The memory array 110 includes, for example, m memory blocks BLK(0), BLK(1), . . . , BLK(m−1) disposed in a row direction. A plurality of NAND strings is formed in one memory block, and the NAND string is formed by connecting a plurality of memory cells in series. The NAND string may be two-dimensionally formed on a surface of a substrate, or may be three-dimensionally formed on a surface of a substrate. In addition, the memory cell may be a single level cell (SLC) storing one bit (binary data), or may be a multi-level cell (MLC) storing a plurality of bits. One NAND string is formed by connecting a plurality of memory cells (for example, 64 cells), a bit line side selecting transistor, and a source line side selecting transistor in series. A drain of the bit line side selecting transistor is connected to a corresponding bit line GBL, and a source of the source line side selecting transistor is connected to a common source line SL.

FIG. 4 is an exemplary table representing bias voltages applied during various actions of a NAND flash memory. In a read action, a positive voltage is applied to a bit line, a voltage (for example, 0V) is applied to a selected word line, and a pass voltage Vpass (for example, 4.5V) is applied to a non-selected word line. A positive voltage (for example, 4.5V) is applied to a selected gate line SGD and a selected gate line SGS, so that the bit line side selecting transistor and the source line side selecting transistor of the NAND string are turned on, and 0V is applied to the common source line. In a programming (writing) action, a high programming voltage Vpgm (15V to 20V) is applied to a selected word line, an intermediate level (for example, 10V) is applied to a non-selected word line, so that the bit line side selecting transistor is turned on and the source line side selecting transistor is turned off, and a level corresponding to data "0" or "1" is supplied to the bit line. In an erase action, 0V is applied to a selected word line in a block, a high voltage (for example, 20V) is applied to a P well, and electrons of a floating gate are extracted to the substrate. In this way, a block is used as a unit to erase data.

Figure 1:
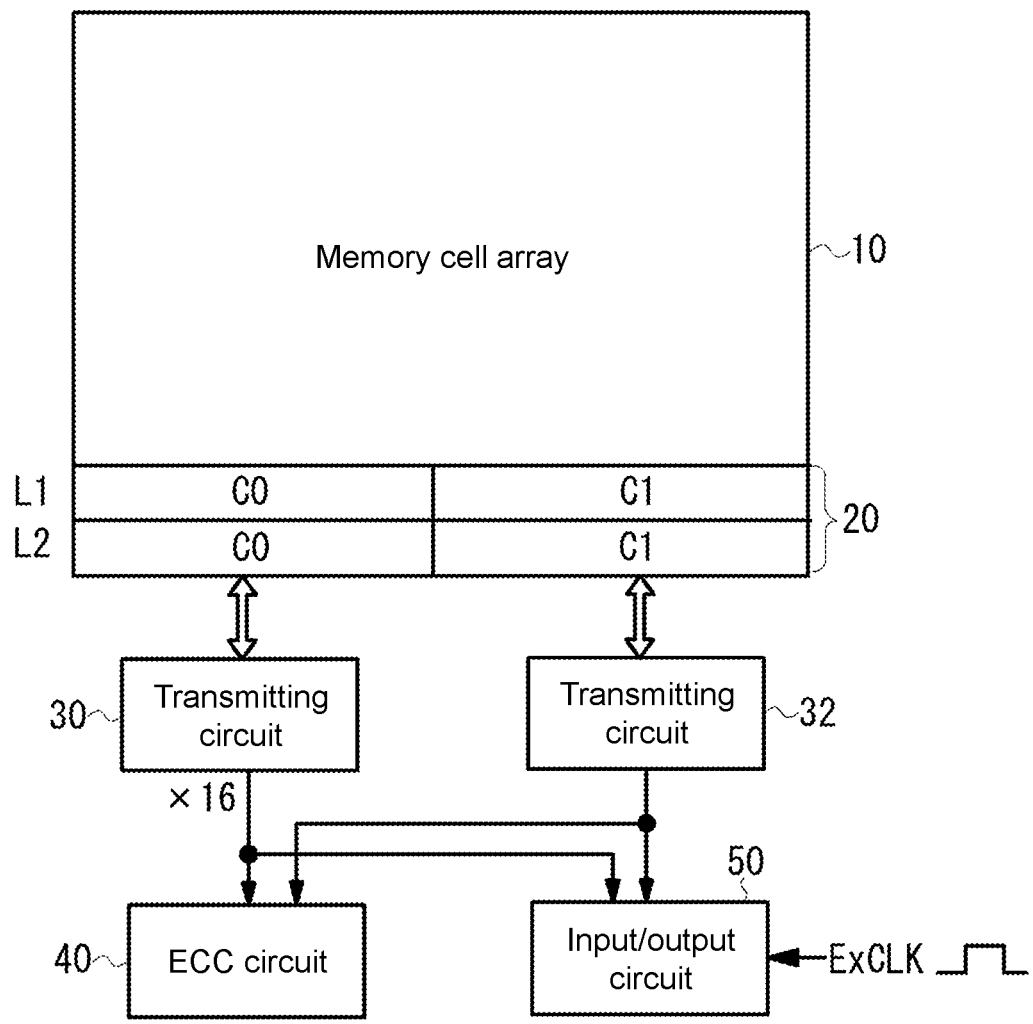
FIG. 1 is a diagram of general composition of an existing NAND flash memory.

As shown in FIG. 1, for example, the page buffer/sensing circuit 170 includes two latches L1 and L2. The latches L1 and L2 each include a first cache C0 and a second cache C1 that are capable of working independently. A transmitting gate capable of performing bidirectional data transmission is connected between the latch L1 and the latch L2. The latch L1 transmits data to the latch L2 or the latch L2 transmits data to the latch L1 by turning on the transmitting gate.

Data read from a page selected from a memory cell array is perceived by a read node, and the perceived data is transmitted to the latch L1 and is held in the latch L1. The array is read based on an internal clock signal. On the other hand, data transmission between the latch L1 and the latch L2, data transmission between the latch L2 and the input/output circuit 120 or the ECC circuit 130, and outputting of data from the input/output circuit 120 are performed based on an external clock signal ExCLK supplied externally. Therefore, data transmission of the latch L1 and the latch L2, data outputting, and the array read action are not performed synchronously.

The row selecting circuit 180 selects a read starting position of data in a page according to the input row address Ay, or automatically read data from a beginning position of the page without using the row address. Therefore, the row selecting circuit 180 may further include a row address counter which increases the row address in response to a clock signal.

Then, the continuous read action of the flash memory in the present embodiment is described below. When the controller 150 receives a command of a continuous read action through the input/output circuit 120, the controller 150 controls a continuous read action of a plurality of pages from a starting address, and when the controller 150 receives a command of ending a continuous read action, the continuous read action is ended at an ending address. In the continuous read action, in a period of outputting data from one latch L2, data read from a page selected from the memory cell array is transmitted to the other latch L1. In continuous read, one page is not used as a unit for transmitting data from the latch L1 to the latch L2; instead, one page is divided into two ½ pages (a first cache or a second cache) to perform continuous read. In a period of transmitting data in one cache of the latch L2 to the input/output circuit 120, data in the other cache of the latch L2 is processed by the ECC circuit 130. The data transmitted to the input/output circuit 120 and the external clock signal ExCLK (for example, a rising edge and a falling edge) are outputted from an external input/output terminal to the external synchronously.

Figure 2:
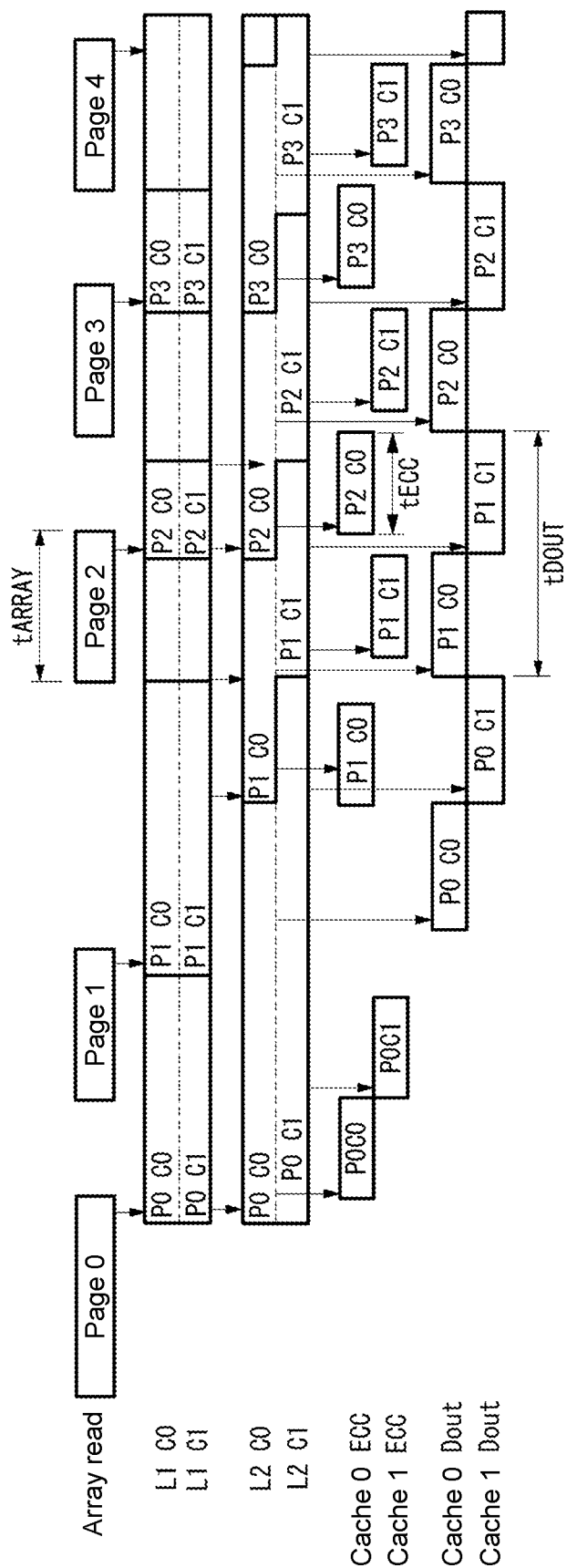
FIG. 2 is a sequence diagram of continuous read performed an existing NAND flash memory.
Figure 5:
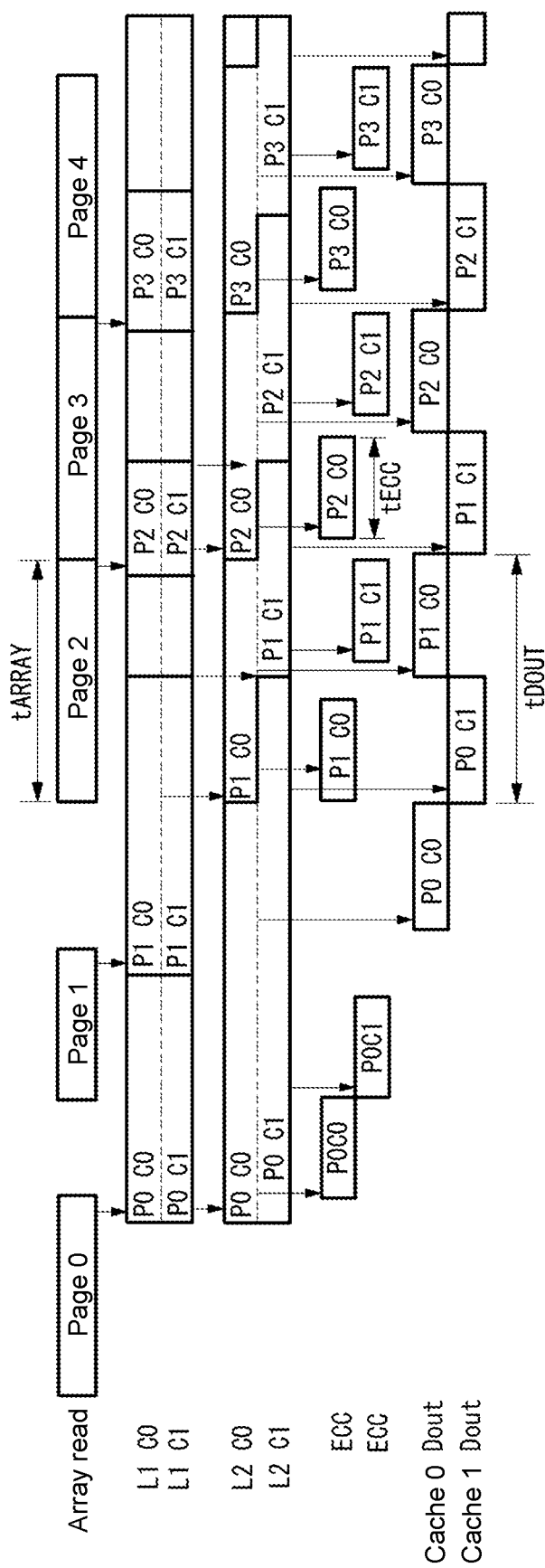
FIG. 5 is a sequence diagram when a NAND flash memory performs continuous read according to an embodiment of the disclosure.

FIG. 5 is a sequence diagram during continuous read performed by using the present embodiment. As shown in FIG. 5, substantial continuous read using the latches L1 and L2 begins with the read of a page P2, and a starting time of array read of the page 2 is earlier than a previous time as shown in FIG. 2. In the previous continuous read, a starting time of array read of the page 2 is a moment when transmission of data of a page P1 from the latch L1 to the latch L2 stops. That is, after the data of the page 1 is held by the latch L2, data of the next page P2 is transmitted to the latch L1.

Correspondingly, in the present embodiment, the starting time of array read of the page P2 is equivalent to a time for transmitting the data of the page P1 from the first cache C0 of the latch L1 to the latch L2. In this case, even the array read time of the page P2 is brought forward, the array read actually needs a certain time. At the moment when the data of the page P2 read from the array is transmitted to the latch L1, if an external clock signal ExCLK with high-speed frequency is used to achieve continuous read with high speed, the transmission of the data of the page P1 from the latch L1 to the latch L2 has been finished.

The array read time tARRAY is defined by a starting time of array read and an end time of array read. An end time of array read of the page P2 is a starting time of array read of the next page P3, when page P2, page P3, page P4, and the like are continuously read, the array read time tARRAY is also continuous.

In this way, in the present embodiment, by bringing forward the read starting time of the memory cell array in the continuous read action, the limitation of the continuous read action is relieved as shown in expression (3), and data may be output by using an external clock signal ExCLK with high-speed frequency.

$$tARRAY < tDOUT \text{ (one page)}$$

$$tECC < tDOUT \text{ (½ page)} \quad (3)$$

That is, as long as the limitation below is met, a time tDOUT for outputting data of one page is greater than the array read time tARRAY, and a time tDOUT for outputting data of ½ page is greater than a time tECC for ECC processing. Therefore, high-speed continuous read may be implemented compared with the existing technology. In FIG. 5 shows that, a total outputting time tDOUT of a time used for outputting data of a page P0 in a second cache and a time used for outputting data of a page P1 in a first cache is greater than the array read time tARRAY of the page P2, and the array read time tARRAY of the page P2 may last from a moment when data of the page P1 in the first cache C0 begins to be transmitted from the latch L1 to the latch L2 to a moment when data of the next page P2 in a first cache C0 begins to be transmitted from the latch L1 to the latch L2. Compared with the time tECC for performing ECC processing on data in a first cache of the latch L2, a time tDOUT for outputting data in a second cache of the latch L2 is greater.

However, the starting time of this kind of array read is changed, and therefore other limitations on time are generated. In a case that the user uses an external clock signal ExCLK with slow frequency, at a moment when data read from a selected page of the memory cell array is transmitted to the latch L1, the latch L1 still holds data of the previous page due to the slow frequency of the external clock signal ExCLK, and the data of the previous page in the latch L1 is destructed by the data of the next page read from the memory cell array. This is described with reference to FIG. 6(A) and FIG. 6(B).

Figure 6A:
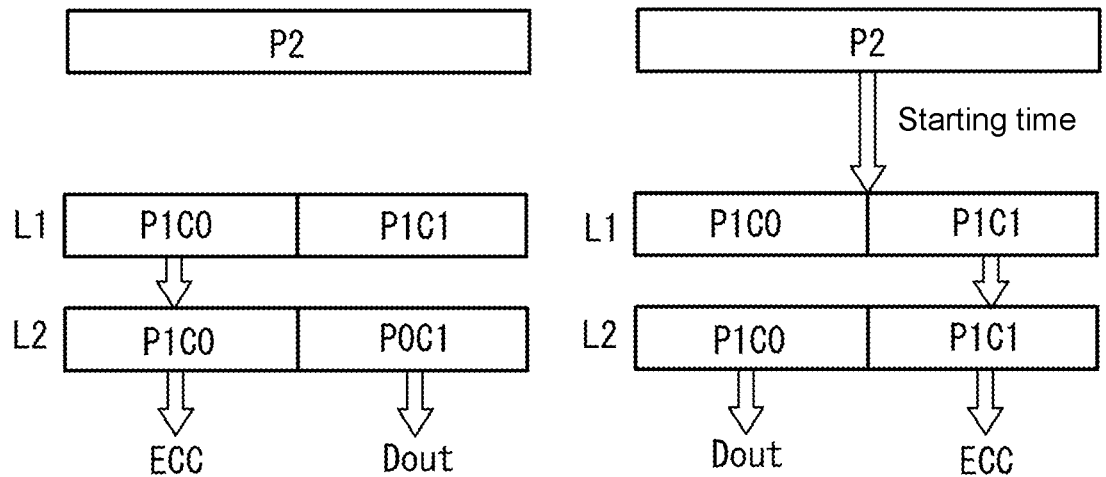
FIG. 6(A) is a diagram illustrating a time for existing array read.
Figure 6B:
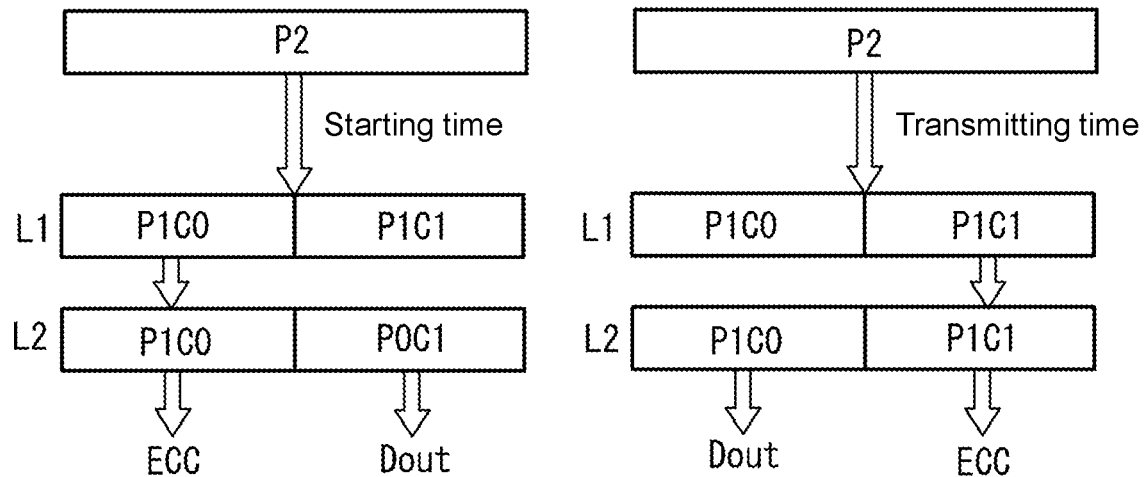
FIG. 6(B) is a diagram illustrating a time for array read of an embodiment, and is a diagram of an example that data is destructed in a case of slow frequency of an external clock signal.

FIG. 6(A) represents array read of the previous page P2. When the array read of the page P2 is started, the data of the page P1 has been transmitted from the latch L1 to the latch L2. Even if the data of the page P2 in the latch L1 is covered, no problem may occur. FIG. 6(B) represents array read of the page P2 in the present embodiment. A time for starting the array read of the page P2 is approximately equivalent to a time for starting transmitting data from the latch L1 to the latch L2. Therefore, when the data of the page P2 read from the memory cell array is transmitted to the latch L1, if the transmission of data from the latch L1 to the latch L2 is not finished, the data of the page P1 that remains in the latch L1 may be covered by the page P2 and destructed.

Expression (4) represents a limitation for avoiding such data destruction.

$$tDOUT \text{ (one-second page)} < tARRAY \quad (4),$$

$$\text{that is, } tDOUT \text{ (one page)} < tARRAY \times 2 \quad (4).$$

Figures 7, 8:
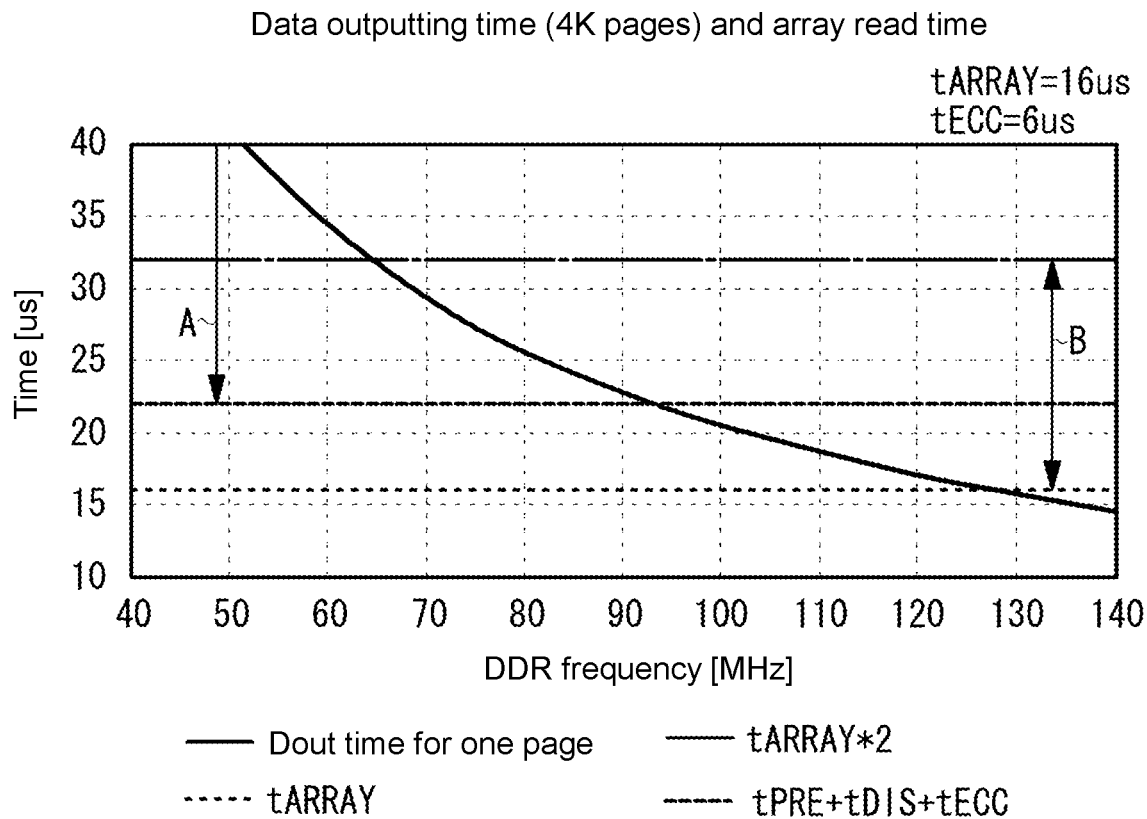
FIG. 7 is a table representing a relationship between a time for outputting data of one page at double data rate (DDR) and a time for array read.
FIG. 8 is a diagram illustrating a register holding setting information related to a time for array read in continuous read.

FIG. 7 is a table of a summary of limitations on time when continuous read is performed. This table is based on the premise that a size of one page is 4 KB, tARRAY=16 µs, tECC=6 µs, and I/O of the input/output circuit is ×8. A horizontal axis represents frequency Fr of an external clock signal ExCLK when data outputting is performing at DDR, and a vertical axis represents a time [µs].

The previous continuous read time (FIG. 2) may support an area indicated by an arrow A. That is, an upper limit of the frequency Fr of the external clock signal ExCLK at DDR is approximately 90 MHz. On the other hand, the continuous read time of the present embodiment (FIG. 5) may support an area indicated by an arrow B based on the limitations of the expression (3) and the expression (4). That is, the frequency Fr of the external clock signal ExCLK is approximately 65 MHz to 120 MHz.

In this way, in the continuous read of the present embodiment, by bringing forward the starting time of the array read, the maximum frequency of the external clock signal ExCLK at DDR is increased from 90 MHz to DDR 120 MHz, thereby reducing the read time.

In addition, in a case that a user uses an external clock signal ExCLK with low-speed frequency, it is ideal to use the previous continuous read time. Therefore, in the continuous read of the present embodiment, starting time of two kinds of array read based on the frequency of the external clock signal ExCLK may be used. For example, if a user uses an external clock signal ExCLK with lower-speed frequency, to avoid destructing data in the latch L1, the controller 150 uses the previous time (FIG. 2) to control the continuous read. If a user uses an external clock signal ExCLK with high-speed frequency, the controller 150 uses a time limited by the expression (3) and expression (4) to control the continuous read.

In an embodiment, the controller 150 switches the starting time of the array read based on an external user input. In addition to inputting a command of starting a continuous read action, the user further inputs a switch command for selecting a time corresponding to the frequency of an external clock signal used. For example, in a case that an external clock signal with high-speed frequency is to be used in a continuous read action, a switch command of selection the time shown in FIG. 5 is input. In a case that the controller 150 inputs the switch command, array read is performed according to the time shown in FIG. 5 in the continuous read action. Assuming that the switch command is not input, array read is performed by using the time shown in FIG. 2 (a preset state).

In other embodiments, the flash memory 100 includes a state register 200, and the state register 200 holds a setting value related to a time of array read in continuous read. The state register 200 includes two setting values shown in FIG. 8. A setting value "1" corresponds to an external clock signal ExCLK with high-speed frequency. When the setting value is set to "1", the controller 150 performs array read by using the time shown in FIG. 5 in the continuous read action. A setting value "0" corresponds to an external clock signal ExCLK with low-speed frequency. When the setting value is set to "0", the controller 150 performs array read by using the time shown in FIG. 2 in the continuous read action.

The setting value of the state register 200 may be rewritten from the external, and a user may input an external rewriting command and an address "XXh" of the state register 200, to change the setting value of the state register. For example, a setting value "0" is a preset state. In a case that the user uses an external clock signal ExCLK with high-speed frequency, the setting value is rewritten to "1". In addition, FIG. 8 represents an example of definitions of the setting values "0" and "1".

Figure 9:
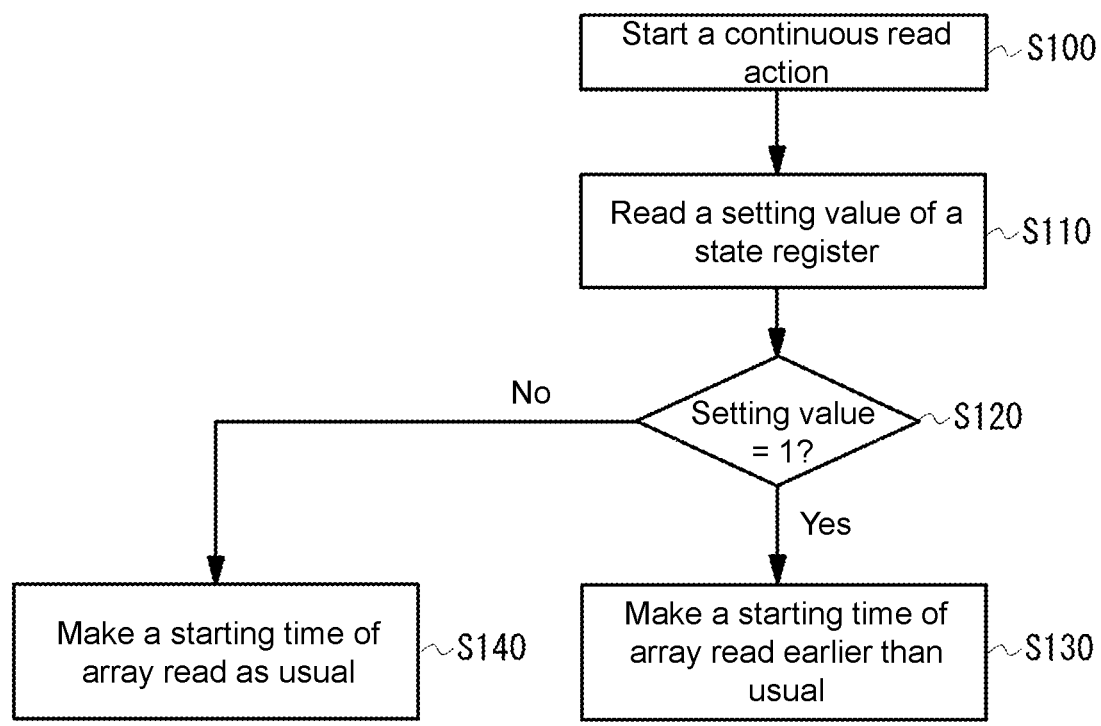
FIG. 9 is a flowchart of continuous read actions according to an embodiment of the disclosure.

FIG. 9 is a flowchart of a continuous read action using a state register. When receiving a command of continuous read, the controller 150 starts a continuous read action (S100), and then, reads a setting value (S110) held in the state register 200. If the setting value is "1", the controller 150 performs time control (S130) to make the starting time of the array read earlier than usual, and if the setting value is "0" (a preset state), common time control (S140) shown in FIG. 2 is performed.

What is claimed is:

1. A continuous read method, for a NAND flash memory, comprising:
   a step for reading data from a memory cell array based on setting information related to a read time and a frequency of an external clock signal of the memory cell array in continuous read;
   a step for holding the data read; and
   a step for outputting the data held synchronously with an external clock signal corresponding to the setting information.

2. The continuous read method according to claim 1, wherein the continuous read method further comprises externally inputting the setting information.

3. The continuous read method according to claim 1, wherein the continuous read method further comprises holding the setting information.

4. The continuous read method according to claim 1, wherein the setting information comprises:
   a first value or a second value, the first value defines a first read time corresponding to high-speed frequency of the external clock signal, the second value defines a second read time corresponding to low-speed frequency of the external clock signal, and the first read time is earlier than the second read time.

5. The continuous read method according to claim 1, wherein the continuous read method further comprises performing error checking and correction (ECC) on the data held, when the setting information comprises a first value, a limitation of tARRAY<a first time required for outputting one page and tECC<a second time required for outputting half page is defined, and when the setting information comprises a second value, a limitation of tARRAY+tECC<the first time is defined, wherein tARRAY is a time for reading data from the memory cell array, tECC is a time for performing ECC on half page.

6. The continuous read method according to claim 5, wherein the step for holding comprises a first latch for holding the data read from the memory cell array and a second latch for holding data transmitted from the first latch, the first latch and the second latch each comprise a first part and a second part transmit data independently, the first part and the second part hold data of half page, when data of the first part of the second latch is outputted, ECC is performed on data of the second part of the second latch, and when the data of the second part of the second latch is outputted, ECC is performed on the data of the first part of the second latch.

7. The continuous read method according to claim 6, wherein when the setting information comprises the first value, tARRAY is a time for reading data of n pages of the memory cell array, the first time is a time for outputting the data of the first part of (n−1) pages and the data of the second part of (n−2) pages.

8. A semiconductor apparatus, comprising a NAND memory cell array, comprising:
   a reading component, configured to read data from a memory cell array;
   a holding component, configured to hold data read by the reading component;
   an outputting component, outputting the data held by the holding component synchronously with an external clock signal; and
   a control component, configured to control the reading component, wherein
   the control component controls continuous read based on setting information related to a read time and a frequency of the external clock signal of the memory cell array in continuous read; and
   the outputting component outputs the data held by the holding component synchronously with an external clock signal corresponding to the setting information.

9. The semiconductor apparatus according to claim 8, wherein the semiconductor apparatus further comprises an inputting component configured to externally input the setting information.

10. The semiconductor apparatus according to claim 8, wherein the semiconductor apparatus further comprises a register configured to hold the setting information.

11. The semiconductor apparatus according to claim 8, wherein the setting information comprises:
    a first value or a second value, the first value defines a first read time corresponding to high-speed frequency of the external clock signal, the second value defines a second read time corresponding to low-speed frequency of the external clock signal, and the first read time is earlier than the second read time.

12. The semiconductor apparatus according to claim 8, wherein the semiconductor apparatus further comprises an error checking and correction (ECC) component for performing ECC on the data held, when the setting information comprises a first value, a limitation of tARRAY<a first time required for outputting one page and tECC<a second time required for outputting half page is defined, and when the setting information comprises a second value, a limitation of tARRAY+tECC<tDOUT is defined, wherein tARRAY is a time for reading data from the memory cell array, tECC is a time for performing ECC on half page.

13. The semiconductor apparatus according to claim 8, wherein the holding component comprises a first latch for holding the data read from the memory cell array and a second latch for holding data transmitted from the first latch, the first latch and the second latch each comprise a first part and a second part transmit data independently, the first part and the second part hold data of half page, when data in the first part of the second latch is outputted, ECC is performed on data in the second part of the second latch, and when the data in the second part of the second latch is outputted, ECC is performed on the data in the first part of the second latch.

14. The semiconductor apparatus according to claim 8, wherein the outputting component outputs data in response to a rising edge and a falling edge of the external clock signal.

* * * * *